(12) United States Patent
Koike

(10) Patent No.: US 6,288,950 B1
(45) Date of Patent: Sep. 11, 2001

(54) SEMICONDUCTOR MEMORY DEVICE CAPABLE OF GENERATING OFFSET VOLTAGE INDEPENDENT OF BIT LINE VOLTAGE

(75) Inventor: Hiroki Koike, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/662,144

(22) Filed: Sep. 14, 2000

(30) Foreign Application Priority Data

Sep. 14, 1999 (JP) .................................................. 11-259682

(51) Int. Cl.$^7$ ........................................................ G11C 7/00
(52) U.S. Cl. ...................... 365/189.09; 365/117; 365/145
(58) Field of Search .................................... 365/196, 201, 365/145, 117, 189.09, 194, 207

(56) References Cited

U.S. PATENT DOCUMENTS 5,237,533 * 8/1993 Papaliolios ............................ 365/207
5,300,824 4/1994 Iyengar .
5,991,189 * 11/1999 Miwa ...................................... 365/145

FOREIGN PATENT DOCUMENTS 11-39882 2/1999 (JP) .
11-149796 6/1999 (JP) .

OTHER PUBLICATIONS

European Search Report dated Feb. 5, 2001.

* cited by examiner

*Primary Examiner*—David Nelms
*Assistant Examiner*—Thong Le
(74) *Attorney, Agent, or Firm*—McGinn & Gibb, PLLC

(57) ABSTRACT

In a semiconductor memory device including a plurality of word lines, a plurality of pairs of bit lines, a plurality of memory cells, each connected between one of the word lines and one of the bit lines, and a plurality of sense amplifiers for amplifying the difference in potential between the pair of the bit lines, a plurality of offset circuits, is provided, for applying an offset voltage independent of voltages at the bit lines, to at least one of the pair of the bit lines to reduce the difference in potential between the pair of the bit lines before the sense amplifiers are operated.

21 Claims, 16 Drawing Sheets

SEMICONDUCTOR MEMORY DEVICE CAPABLE OF GENERATING OFFSET VOLTAGE INDEPENDENT OF BIT LINE VOLTAGE

BACKGROUND OF THE INVENTION

1. Field of the Invention

The present invention relates to a semiconductor memory device such as a ferroelectric random access memory (FeRAM) device, and more particularly, to the improvement of a reliability test or a burn-in test of the semiconductor memory device.

2. Description of the Related Art

In a prior art semiconductor memory device including a plurality of word lines, a plurality of pairs of bit lines, a plurality of memory cells each connected between one of the word lines and one of the bit lines, and a plurality of sense amplifiers for amplifying the difference in potential between the pair of the bit line a plurality of offset circuits is provided for applying an offset voltage to at least one of the pair of the bit lines to reduce the difference in potential between the pair of the bit lines before the sense amplifiers are operated, thus carrying out a reliability test, i.e., a burn-in test (see: JP-A-11-149796). This will be explained later in detail.

In the above-described prior art semiconductor memory device, however, the offset voltage is greatly dependent upon the voltage at a bit line. As a result, if the offset voltage is too large, some of normal semiconductor memory devices will be deemed to be defective and scrapped. On the other hand, if the offset voltage is too small, some of defective semiconductor memory devices will pass. Thus, it is impossible to carry out a high reliability test.

SUMMARY OF THE INVENTION

It is an object of the present invention to provide a semiconductor memory device capable of carrying out a high reliability test.

According to the present invention, in a semiconductor memory device including a plurality of word lines, a plurality of pairs of bit lines, a plurality of memory cells each connected between one of the word lines and one of the bit lines, and a plurality of sense amplifiers for amplifying the difference in potential between the pair of the bit lines, a plurality of offset circuits is provided for applying an offset voltage independent of voltages at the bit lines to at least one of the pair of the bit lines, to reduce the difference in potential between the pair of the bit lines before the sense amplifiers are operated.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, a prior art FeRAM device will be explained with reference to FIGS. 1, 2, 3A through 3I, 4A through 4I and 5.

Figure 1:
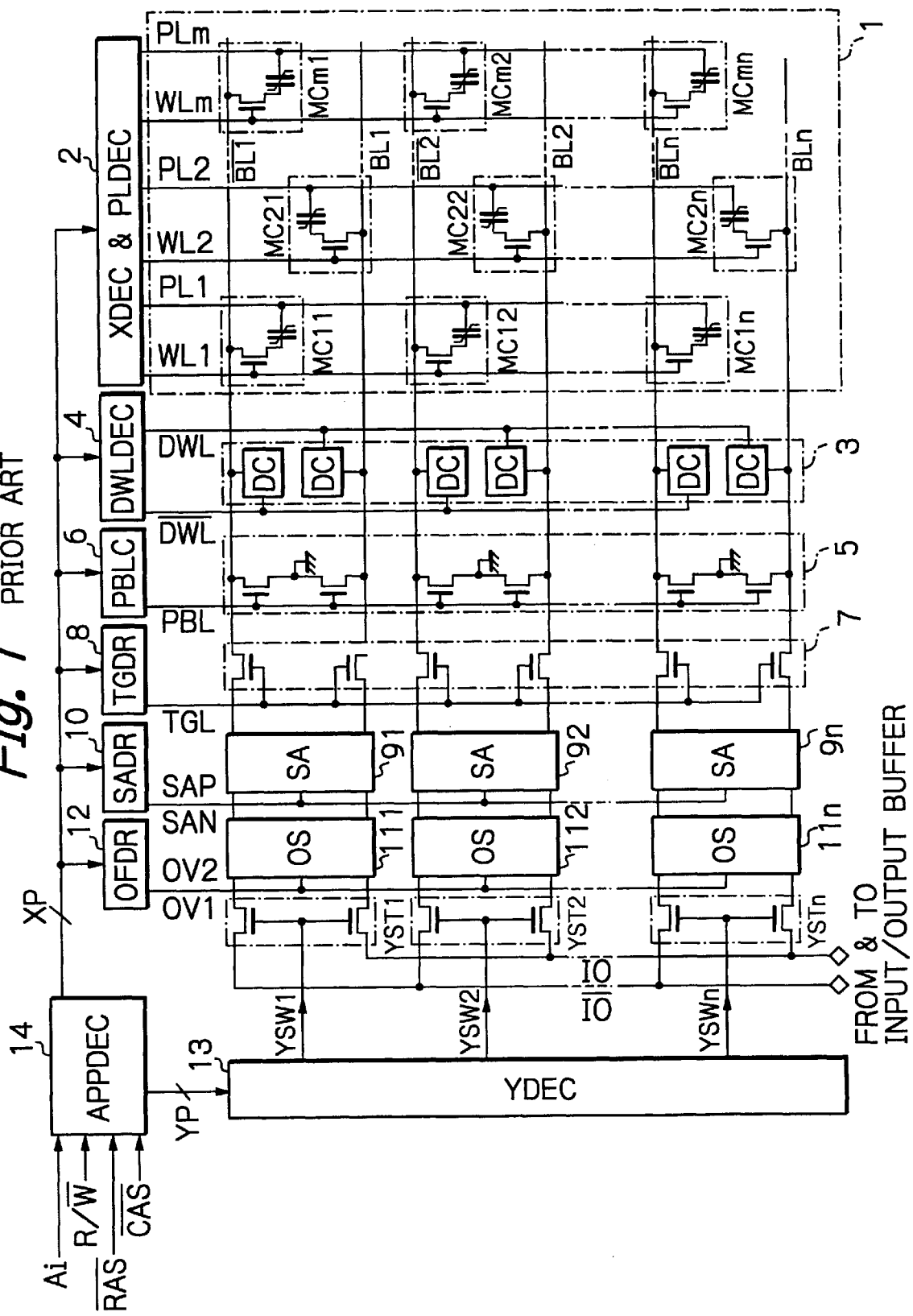
FIG. 1 is a block circuit diagram illustrating a prior art FeRAM device.

In FIG. 1, which illustrates a prior art FeRAM device (see JP-A-11-149796), reference numeral 1 designates a memory cell array including memory cells MCij (i=1, 2, ..., n; j=1, 2, ..., n) of one-transistor, one-ferroelectric capacitor type formed at intersections between word lines WL1, WL2, ..., WLm, plate lines PL1, PL2, ..., PLm and bits lines BL1, $\overline{BL1}$, BL2, $\overline{BL2}$, ..., BLn, $\overline{BLn}$. For example, the memory cell MC22 has a MOS transistor having a gate connected to the word line WL2, a drain connected to the bit line BL2, a source, and a ferroelectric capacitor connected between the source of the transistor and the plate line PL2. The word lines WL1, WL2, ..., WLm and the plate lines PL1, PL2, PLm are controlled by an X decoder/plate decoder 2.

Also, a dummy cell array 3 including dummy cells is connected to the bit lines BL1, $\overline{BL1}$, BL2, $\overline{BL2}$, ..., BLn, $\overline{BLn}$. Each of the dummy cells has a similar configuration to those of the memory cells; however, the capacitance of a capacitor of each of the dummy cells is about half of that of the ferroelectric capacitor of the memory cell array 1. The dummy cells of the dummy cell array 3 are connected to dummy word lines DWL and $\overline{DWL}$ which are controlled by a dummy cell line decoder 4.

Further, a precharging circuit 5 including precharging MOS transistor is connected to the bit lines BL1, $\overline{BL1}$, BL2, $\overline{BL2}$, ..., BLn, $\overline{BLn}$. The precharging transistors of the precharging circuit 5 are connected to a recharging bit line PBL which is controlled by a bit line precharging circuit 6. In this case, the bit lines BL1, $\overline{BL1}$, BL2, $\overline{BL2}$, ..., BLn, $\overline{BLn}$ are precharged by the bit line precharging circuit 6 at GND.

Additionally, a transfer gate circuit 7 including transfer gate Transistors are connected to the bit lines BL1, $\overline{BL1}$, BL2, $\overline{BL2}$, ..., BLn, $\overline{BLn}$. The transfer gate transistors are connected to a transfer gate line TGL which is controlled by a transfer gate drive circuit 8.

Further, sense amplifiers 91, 92, ..., 9n are connected to the bit lines BL1, $\overline{BL1}$, BL2, $\overline{BL2}$, ..., BLn, $\overline{BLn}$ on the outside of the transfer gate circuit 7. The sense amplifiers 91, 92, ..., 9n are connected to sense enable lines SAP and SAN which are controlled by a sense amplifier drive circuit 10.

In addition, offset circuits 111, 112, ..., 11n are connected to the bit lines BL1, $\overline{BL1}$, BL2, $\overline{BL2}$, ..., BLn, $\overline{BLn}$. The offset circuits 111, 112, ..., 11n are connected to offset validation lines OV1 and OV2 which are controlled by an offset drive circuit 12.

Y-selection transfer gates YST1, YST2, ..., YSTn are connected between the bit lines BL1, $\overline{BL1}$, BL2, $\overline{BL2}$, ..., BLn, $\overline{BLn}$ and input/output buses IO and $\overline{IO}$. One of the Y-selection transfer gates YST1, YST2, ..., YSTn is selected by Y-selection switch signals YSW1, YSW2, ..., YSWn which are controlled by a Y decoder 13.

The X decoder/plate decoder 2, the dummy word line decoder 4, the bit line precharging circuit 6, the transfer gate drive circuit 8, the sense amplifier drive circuit 10 and the offset drive circuit 12 are operated by receiving X address decode and control signals XP from an address predecoder 14. On the other hand, the Y decoder 13 is operated by receiving Y address decode and control signals YP from the address predecoder 14. Note that the address predecoder 14 receives address signals Ai, a read/write signal R/$\overline{W}$, a row address strobe signal $\overline{RAS}$, a column address strobe signals $\overline{CAS}$ and the like.

Figure 2:
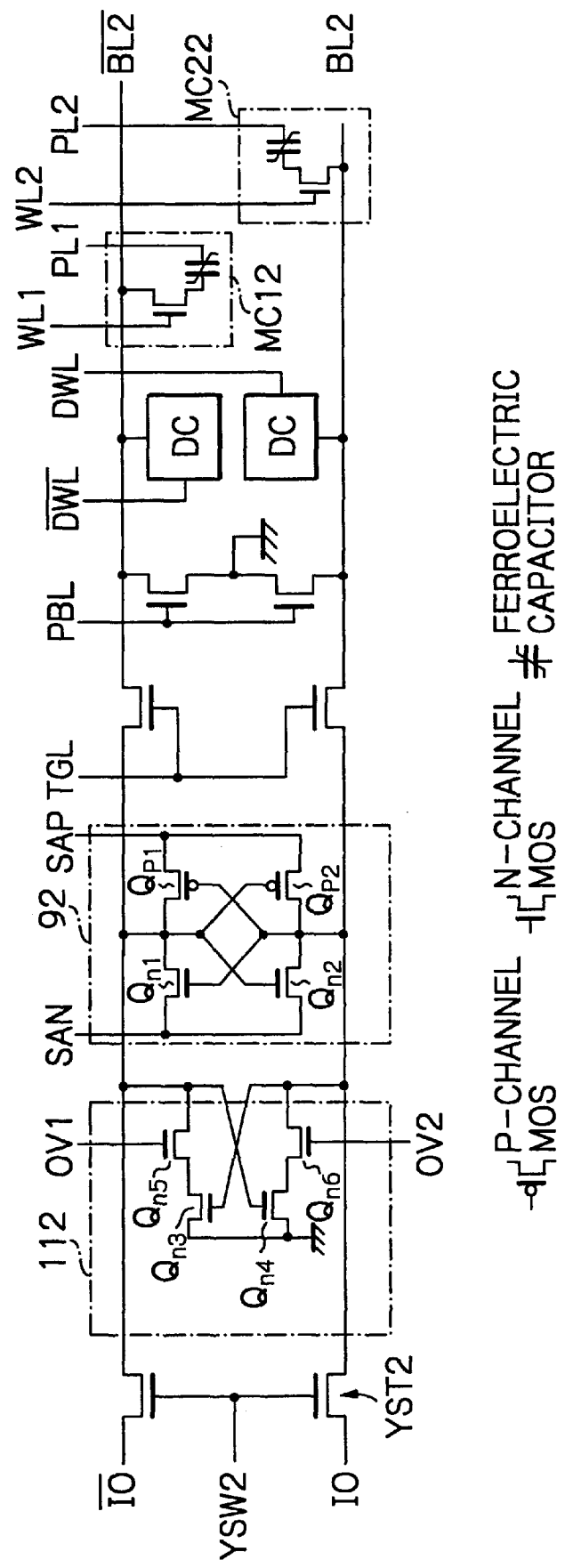
FIG. 2 is a partially-detailed circuit diagram of the FeRAM device of FIG. 1.

In FIG. 2, which is a partially detailed circuit diagram of the FeRAM device of FIG. 1, the sense amplifier such as 92 is constructed by cross-coupled P-channel MOS transistors $Q_{p1}$ and $Q_{p2}$ connected between the bit lines BL2 and $\overline{BL2}$ and the sense enable line SAP, and P-channel MOS transistors $Q_{n1}$ and $Q_{n2}$ connected between the bit lines BL2 and $\overline{BL2}$ and the sense enable line SAN.

Also, the offset circuit such as 112 is constructed by cross-coupled N-channel MOS transistors $Q_{n3}$ and $Q_{n4}$ between the bit lines BL2 and $\overline{BL2}$, and switching N-channel MOS transistors $Q_{n5}$ and $Q_{n6}$ connected between the drains of the transistors $Q_{n3}$ and $Q_{n4}$ and the bit lines BL2 and $\overline{BL2}$. The transistors $Q_{n5}$ and $Q_{n6}$ are controlled by the voltages at the offset validation lines OV1 and OV2, respectively.

The normal read operation of the FeRAM device of FIGS. 1 and 2 is explained with reference to FIGS. 3A through 3I, where data of the memory cell MC22 is read out.

Figure 3:
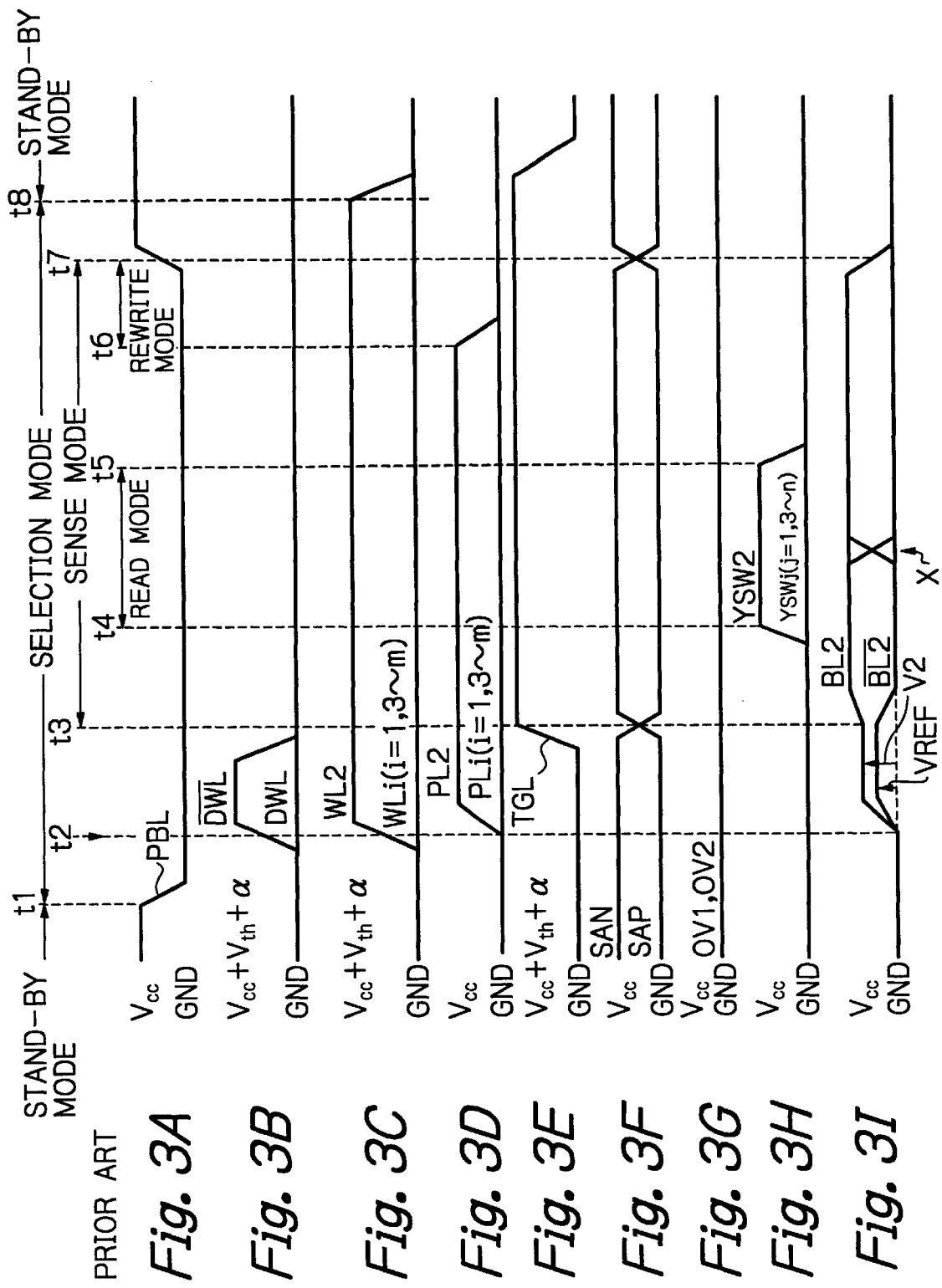
FIGS. 3A through 3I are timing diagrams for explaining the normal operation of the FeRAM device of FIGS. 1 and 2.

First, at time t1, as shown in FIG. 3A, the voltage at the precharging bit line PBL is changed from high (=$V_{CC}$) to low (=GND), thus entering a selection mode from a stand-by mode. As a result, the bit lines BL2 and $\overline{BL2}$ become in a floating state. In the stand-by mode, note that the bit lines BL2 and $\overline{BL2}$ are precharged at GND as shown in FIG. 3I.

Next, at time t2, as shown in FIG. 3B, the voltage at the dummy word line DWL is changed from low (=GND) to high (=$V_{CC}+V_{th}+\alpha$), while the voltage at the dummy word line DWL is unchanged. Here, $V_{CC}$ designates a power supply voltage, $V_{th}$ designates a threshold voltage of the N-channel MOS transistors, and $\alpha$ is a positive value. Therefore, when the voltage at the dummy word line DWL is $V_{CC}+V_{th}+\alpha$, the switching transistors of the corresponding dummy cells are completely turned ON. Thus, as shown in FIG. 3I, the voltage at the bit line $\overline{BL2}$ is pushed up to a reference voltage VREF in accordance with the capacitance of the dummy cell DC.

Simultaneously, as shown in FIG. 3C, the voltage at the word line WL2 is changed from low (=GND) to high (=$V_{CC}+V_{th}+\alpha$), while the voltages at the other word lines are unchanged. Similarly, as shown in FIG. 3D, the voltage at the plate line PL2 is changed from low (=GND) to high (=$V_{CC}+V_{th}+\alpha$), while the voltages at the other plate lines are unchanged. Thus, as shown in FIG. 3I, the voltage at the bit line BL2 is pushed up to a read voltage V2 in accordance with the capacitance of the memory cell MC22. Generally, if the capacitor of the memory cell MC22 stores "0" (changed state), the voltage V2 is higher than the reference voltage VREF, as shown in FIG. 3I.

Next, at time t3, as shown in FIG. 3E, the voltage at the transfer gate line TGL is changed from low (=GND) to high (=$V_{CC}+V_{th}+\alpha$). Also, as shown in FIG. 3F, the voltage at the sense enable line SAP is changed from high (=$V_{CC}$) to low (=GND) and the voltage at the sense enable line SAN is changed from low (=GND) to high (=$V_{CC}$), thus entering a sense mode. As a result, as shown in FIG. 3I, the difference in potential between the bit lines BL2 and $\overline{BL2}$ is enlarged by the operation of the sense amplifier 92.

Next, at time t4, as shown in FIG. 3H, the Y-selection switch signal YSW2 is changed from low (=GND) to high (=$V_{CC}$), while the other Y-selection switch signals are unchanged, thus entering a read mode. As a result, as shown in FIG. 3I, the voltages at the bit lines BL2 and $\overline{BL2}$ are transferred via the Y-selection transfer gate YST2 to the input/output buses IO and $\overline{IO}$, respectively.

Note that, if the operation is a write operation, the voltages at the input/output buses IO and $\overline{IO}$ are transferred via the Y-selection transfer gate YST2 to the bit lines BL2 and $\overline{BL2}$, respectively, as indicated by X in FIG. 3I.

Next, at time t5, as shown in FIG. 3H, the voltage at the Y-selection switch signal YSW2 returns from high to low, thus completing the read mode. In this state, as shown in FIG. 3I, the voltages at the bit lines BL2 and $\overline{BL2}$ are electrically separated from the input/output buses IO and $\overline{IO}$, and therefore, become in a floating state.

Next, at time t6, as shown in FIG. 3D, the voltage at the plate line PL2 is changed from high to low, thus entering a rewrite (refresh) mode. That is, in this case, in the memory cell MC22, since the switching MOS transistor is still turned ON by the high voltage of the word line WL2, the charge at the bit line BL2 is transferred via the switching MOS transistor to the node of the ferroelectric capacitor. Note that this rewrite operation can be surely carried out due to the activated sense amplifier 92.

Next, at time t7, as shown in FIG. 3F, the voltage at the sense enable line SAP is changed from high to low and the voltage at the sense enable line SAN is changed from high to low, thus completing the sense mode as well as the rewrite mode.

Finally, at time t8, as shown in FIG. 3A, the voltage at the precharging bit line PBL is changed from high to low, thus returning from the selection mode to a stand-by mode. As a result, the word line WL2 is again precharged to GND.

Note that the voltage at the transfer gate line TGL is changed from high to low around time t8, as shown in FIG. 3E.

The test operation of the FeRAM device of FIGS. 1 and 2 is explained next with reference to FIGS. 4A and 4I, where the memory cell MC22 is tested.

In a test operation for the memory cell MC22, at time t2', after time t2 and before time t3 the offset circuit 112 is operated to decrease the higher one of the voltages at the bit lines BL2 and $\overline{BL2}$, which makes the read operation difficult. Therefore, if such a test operation is carried out before the shipping, reliability of the FeRAM device can be assured.

Figure 4:
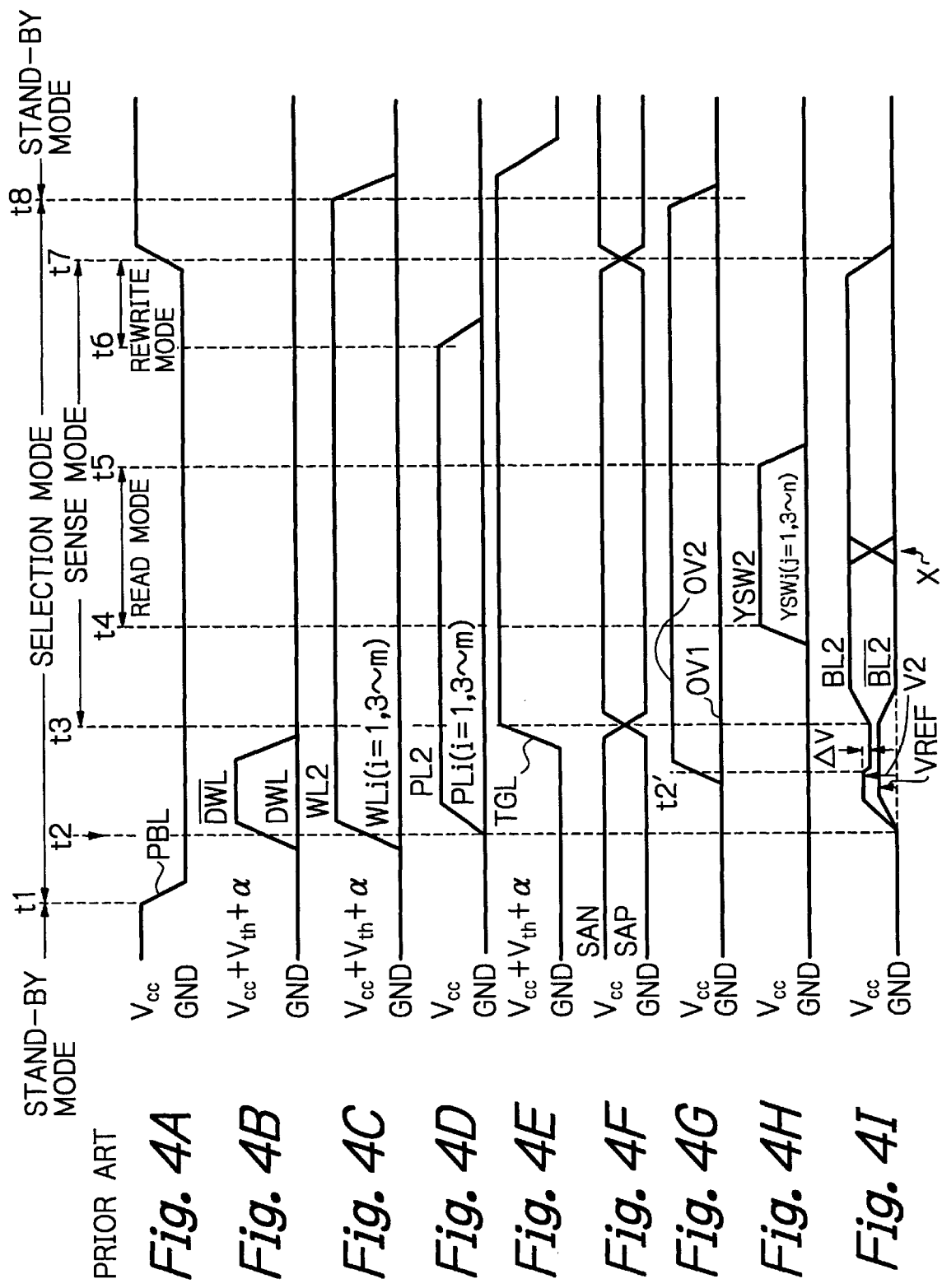
FIGS. 4A through 4I are timing diagrams for explaining the test operation of the FeRAM device of FIGS. 1 and 2.

In more detail, as shown in FIG. 4I, if the voltage at the bit line BL2 is higher than the voltage at the bit line $\overline{BL2}$ before time t2', an ON current flowing through the transistor $Q_{n1}$ is larger than an ON current flowing through the transistor $Q_{n2}$, and an ON current flowing through the transistor $Q_{p1}$ is smaller than an ON current flowing through the transistor $Q_{p2}$. In this state, at time t2', the voltage at the offset validation line OV2 is changed from low (=GND) to high (=$V_{CC}$) while the voltage at the offset validation line OV1 is unchanged. Therefore, a current flowing through the transistors $Q_{n4}$ and $Q_{n6}$ is added to the current flowing through the transistor $Q_{n2}$, so that the voltage at the bit line BL2 is decreased by an offset voltage ΔV.

Figure 5:
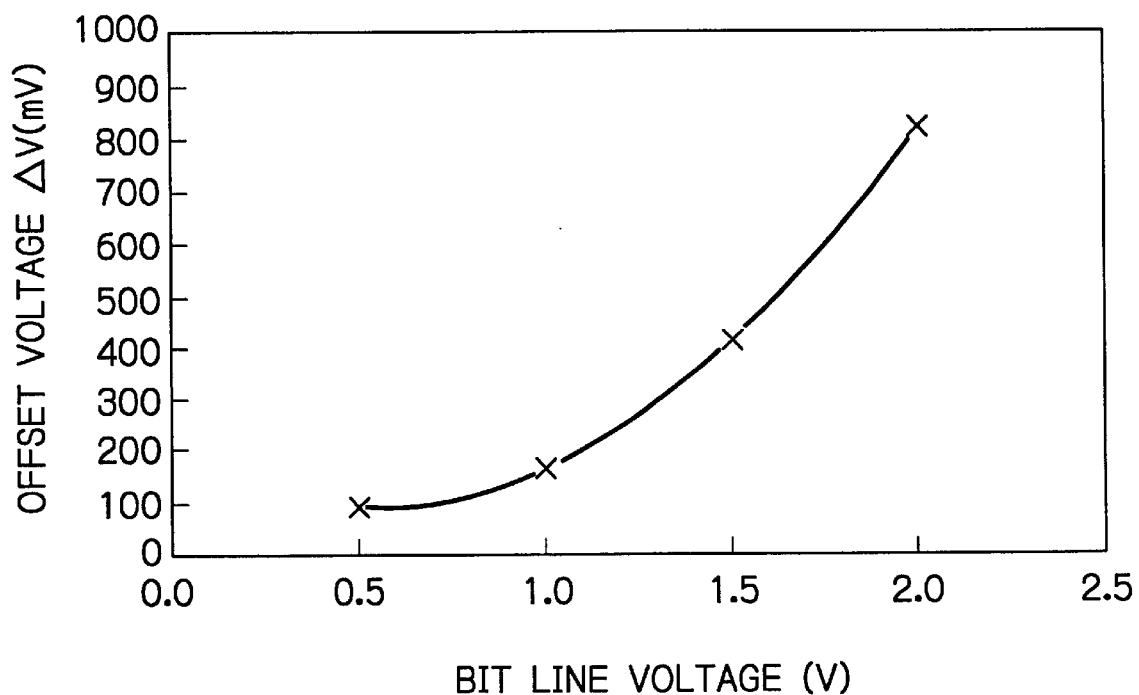
FIG. 5 is a graph showing the offset voltage in the FeRAM device of FIGS. 1 and 2.

In the Fe RAM device of FIGS. 1 and 2, however, the offset voltage ΔV is greatly dependent upon the voltage at the bit line such as $\overline{BL2}$. For example, the ON current flowing through the transistor $Q_{n4}$ is dependent upon its source-to-gate voltage, i.e., the voltage at the bit line $\overline{BL2}$. That is, the higher the voltage at the bit line $\overline{BL2}$, the larger the ON current flowing through the transistor $Q_{n4}$. As a result, as shown in FIG. 5, the higher the voltage at the bit line $\overline{BL2}$, the larger the offset voltage ΔV. In FIG. 5, note that the transistors are manufactured by using a 0.55 μm gate length design.

Thus, in the FeRAM device of FIGS. 1 and 2, since the offset voltage greatly fluctuates, it is impossible to carry out a high reliability test.

Figure 6:
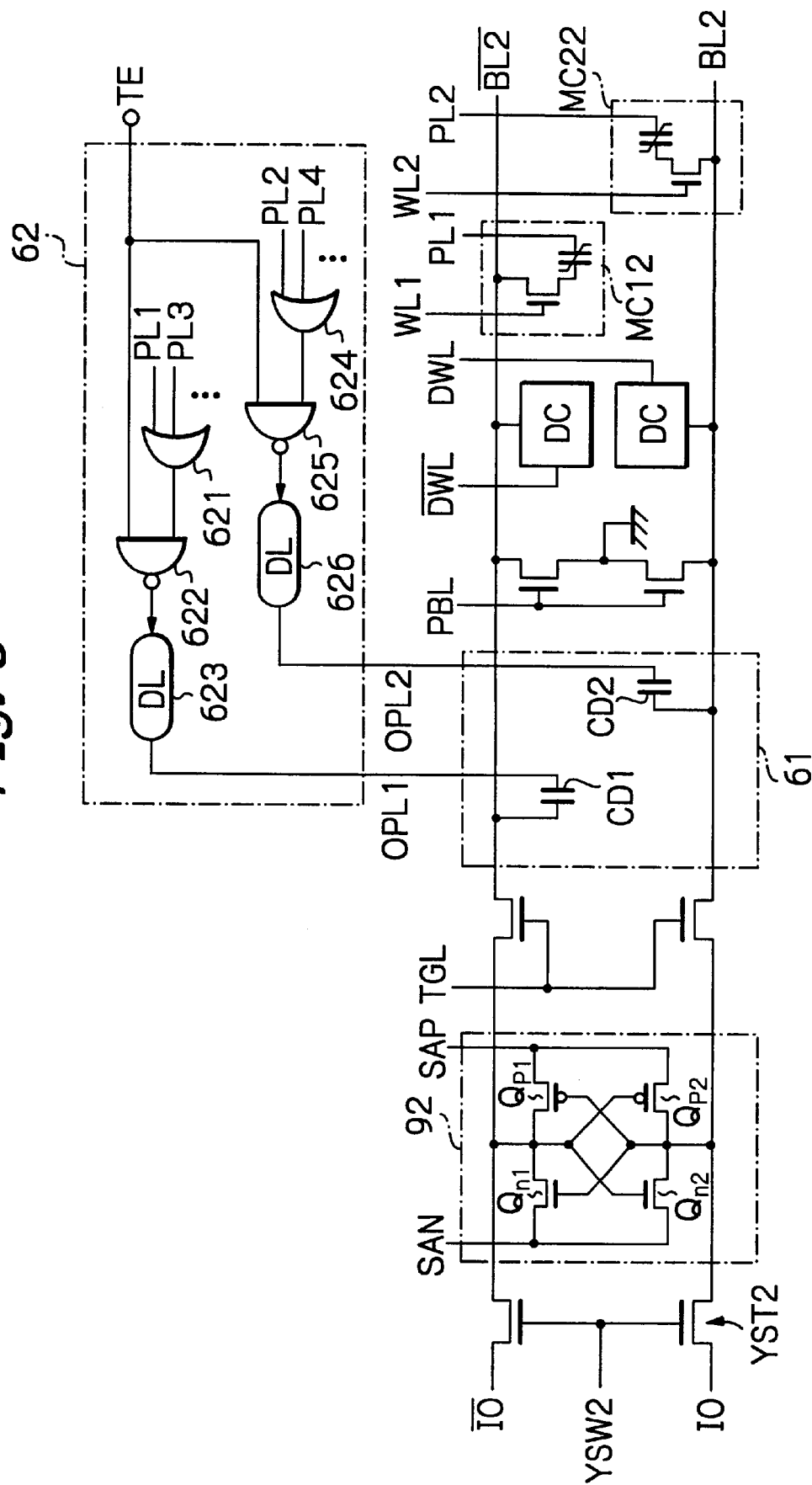
FIG. 6 is a circuit diagram illustrating a first embodiment of the FeRAM device according to the present invention.

In FIG. 6, which illustrates a first embodiment of the present invention, an offset circuit 61 is provided instead of the offset circuit 112 of FIG. 2. Note that the same offset circuit 61 is connected to the bit lines other than the bit lines BL2 and $\overline{BL2}$. The offset circuit 61 as well as the other offset circuits are controlled by an offset control circuit 62.

The offset circuit 61 is constructed by a capacitor CD1 connected to the bit line $\overline{BL2}$ and a capacitor CD2 connected to the bit line BL2.

The offset control circuit 62 is constructed by an OR circuit 621 for receiving the signals of the plate lines PL1, PL3, ..., a NAND circuit 622 for receiving the output signal of the OR circuit 621 and a test signal TE at a test terminal, and a delay circuit 623 for delaying the output signal of the NAND circuit 622 to generate an offset control signal OPL1. Also, the offset control circuit 62 is constructed by an OR circuit 624 for receiving the signals of the plate lines PL2, PL4, ..., a NAND circuit 625 for receiving the output signal of the OR circuit 624 and the test signal TE at the test terminal, and a delay circuit 626 for delaying the output signal of the NAND circuit 625 to generate an offset control signal OPL2. The offset control signals OPL1 and OPL2 are supplied to the capacitors CD1 and CD2 of the offset circuit 61.

The test operation of the FeRAM device of FIG. 6 is explained next with reference to FIGS. 7A through 7I, where the memory cell MC22 is tested and the test signal TE is "1" (high).

Figure 7:
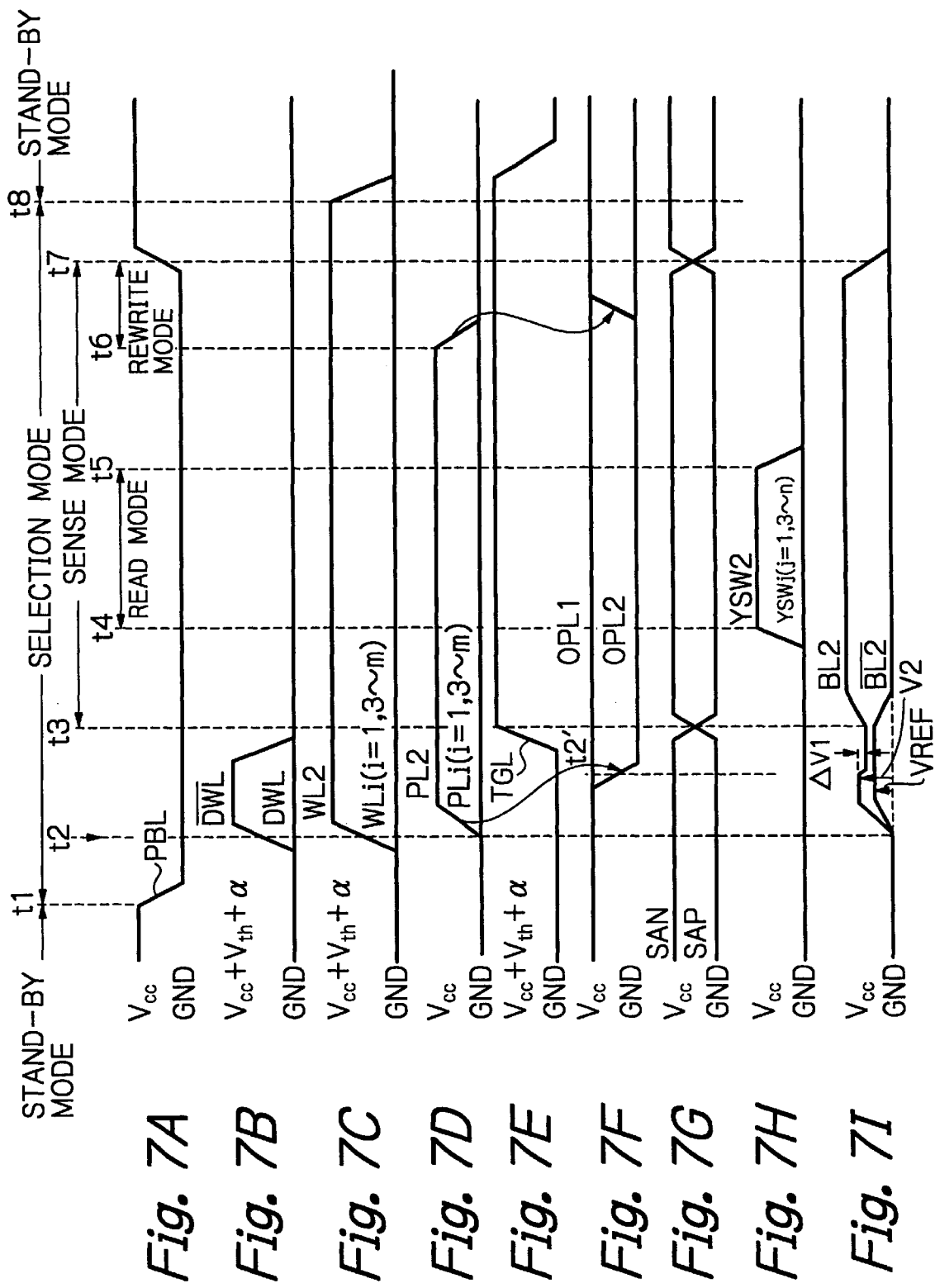
FIGS. 7A through 7I are timing diagrams for explaining the normal operation of the FeRAM device of FIG. 6.

In a test operation for the memory cell MC22, the offset control circuit 62 is operated to generate an offset control signal OPL2 at time t2' after time t2 and before time t3, as shown in FIG. 7F. That is, at time t2, as shown in FIG. 7D, when the voltage at the plate line PL2 is changed from low to high, the output signal of the OR circuit 624 is changed from low to high, so that the output signal of the NAND circuit 625 is changed from high to low. As a result, after a delay time determined by the delay circuit 626, the delayed output signal, i.e., the offset control signal OPL2 is changed from high to low, as shown in FIG. 7F. Thus, the voltage at the bit line BL2 is decreased by an offset voltage ΔV1 defined by $$\Delta V1 = V2 \cdot CD/(CD+CB) \tag{1}$$

where V2 is the voltage at the bit line BL2 immediately before the offset operation;
CD is a capacitance of the capacitor CD2; and
CB is a parasitic capacitance of the bit line BL2.

Then, at time t6, as shown in FIG. 7D, when the voltage at the plate line PL2 is changed from high to low, the output signal of the OR circuit 624 is changed from high to low, so that the output signal of the NAND circuit 625 is changed from low to high. As a result, after a delay time determined by the delay circuit 626, the delayed output signal, i.e., the offset control signal OPL2 is changed from low to high, as shown in FIG. 7F.

Figure 8:
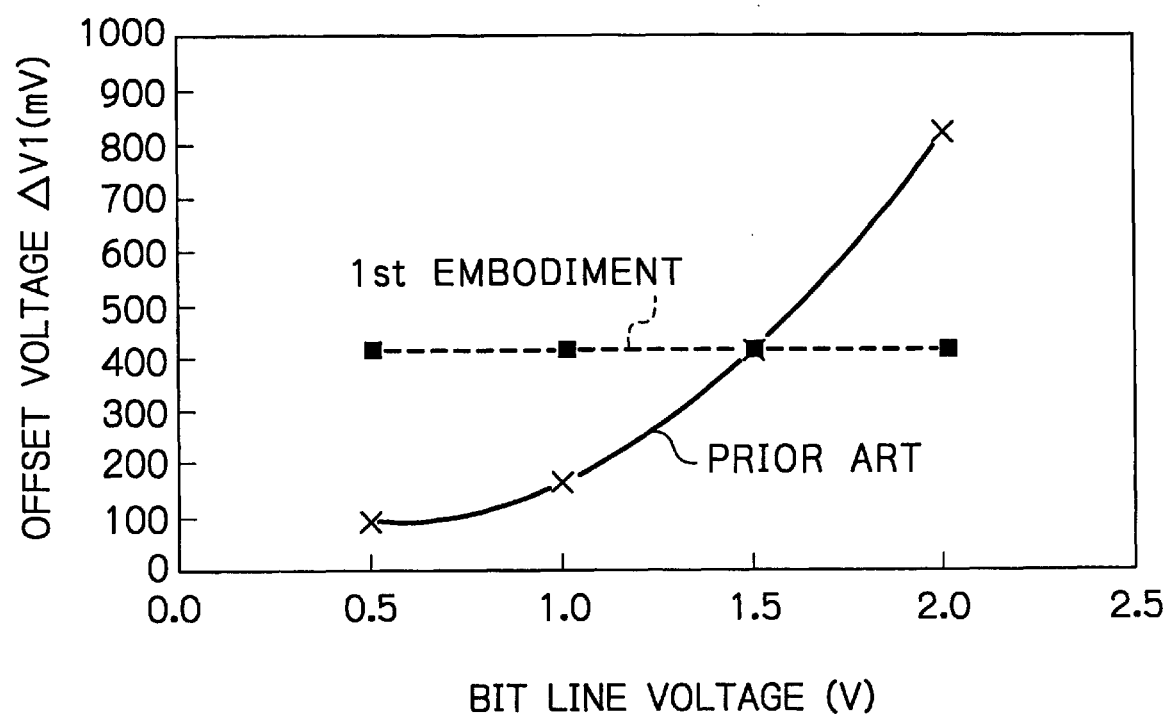
FIG. 8 is a graph showing the offset voltage in the FeRAM device of FIG. 6.

In the first embodiment, the offset voltage ΔV1 is not dependent upon the voltage at the bit line such as BL2. In other words, as shown in FIG. 8, even when the voltage at the bit line BL2 is higher, the offset voltage ΔV1 is unchanged. Thus, in the FeRAM device of FIG. 6, since the offset voltage hardly fluctuates, it is possible to carry out a high reliability test.

Figure 9:
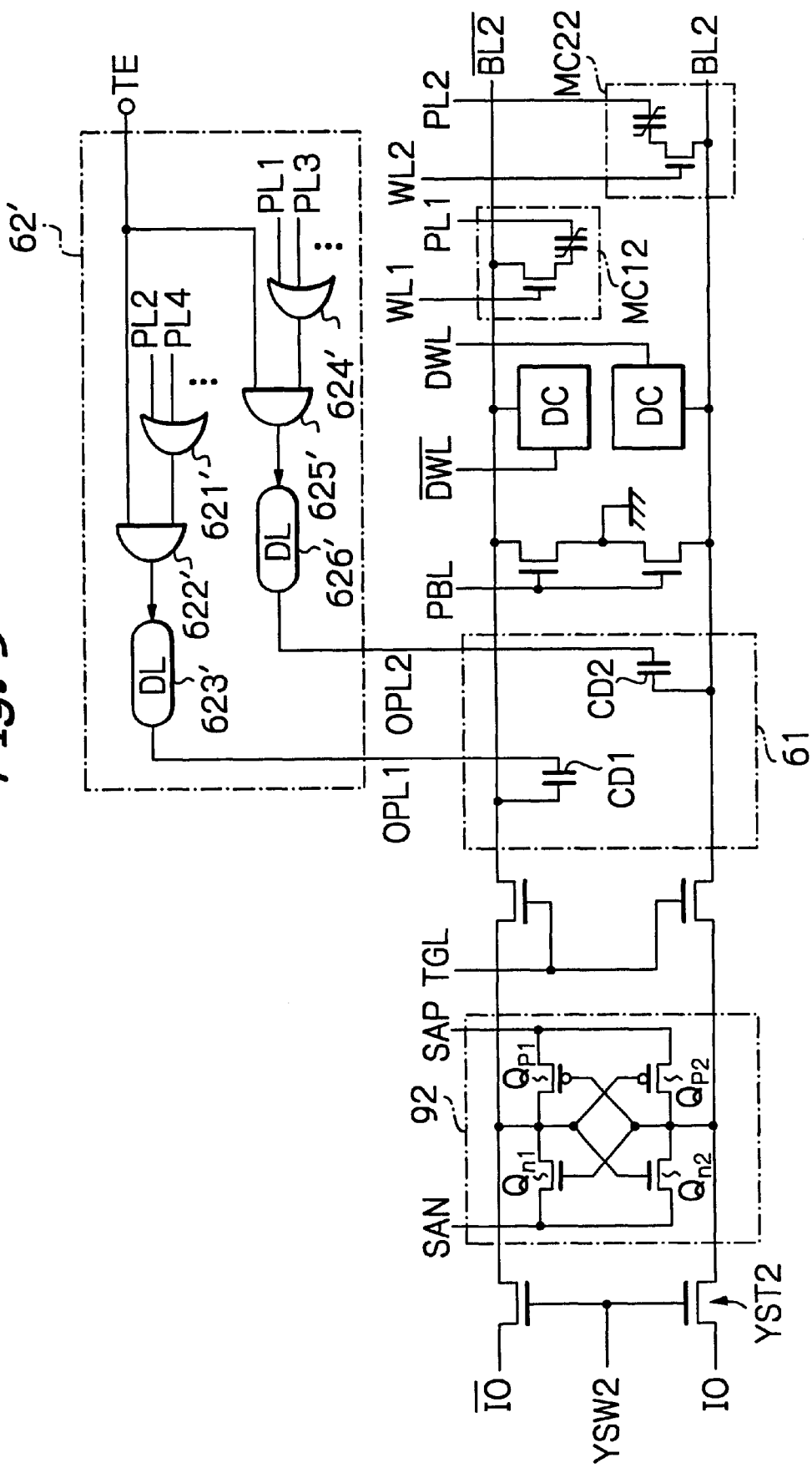
FIG. 9 is a circuit diagram illustrating a second embodiment of the FeRAM device according to the present invention.

In FIG. 9, which illustrates a second embodiment of the present invention, an offset control circuit 62' is provided instead of the offset control circuit 62 of FIG. 6.

The offset control circuit 62' is constructed by an OR circuit 621' for receiving the signals of the plate lines PL2, PL4, ..., a AND circuit 622' for receiving the output signal of the OR circuit 621' and the test signal TE, and a delay circuit 623' for delaying the output signal of the AND circuit 622' to generate an offset control signal OPL1. Also, the offset control circuit 62' is constructed by an OR circuit 624' for receiving the signals of the plate lines PL1, PL3, ..., an AND circuit 625' for receiving the output signal of the OR circuit 624' and the test signal TE, and a delay circuit 626' for delaying the output signal of the AND circuit 625' to generate an offset control signal OPL2.

The test operation of the FeRAM device of FIG. 9 is explained next with reference to FIGS. 10A through 10I, where the memory cell MC22 is tested and the test signal TE is "1" (high).

Figure 10:
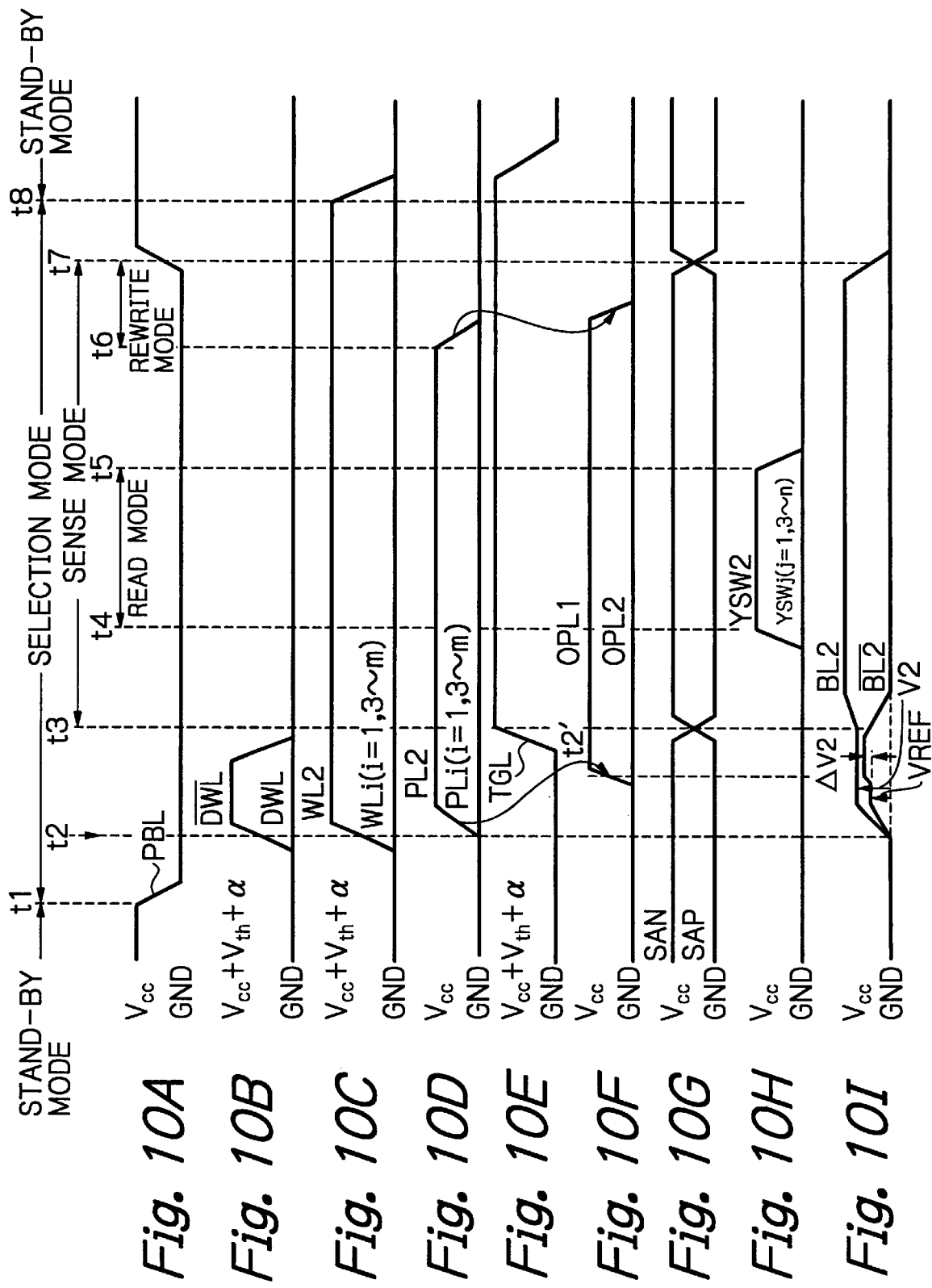
FIGS. 10A through 10I are timing diagrams for explaining the normal operation of the FeRAM device of FIG. 9.

In a test operation for the memory cell MC22, the offset control circuit 62' is operated to generate an offset control signal OPL1 at time t2' after time t2 and before time t3, as shown in FIG. 10F. That is, at time t2, as shown in FIG. 10D, when the voltage at the plate line PL2 is changed from low to high, the output signal of the OR circuit 621' is changed from low to high, so that the output signal of the AND circuit 622' is changed from low to high. As a result, after a delay time determined by the delay circuit 623', the delayed output signal, i.e., offset control signal OP1 is changed from low to high, as shown in FIG. 10F. Thus, the voltage at the bit line $\overline{BL2}$ is increased by an offset voltage ΔV2 defined by $$\Delta V2 = VREF \cdot CD/(CD+CB) \tag{2}$$

where VREF is the voltage at the bit line $\overline{BL2}$ immediately before the offset operation;
CD is a capacitance of the capacitor CD1; and
CB is a parasitic capacitance of the bit line $\overline{BL2}$.

Then, at time t6, as shown in FIG. 10D, when the voltage at the plate line PL2 is changed from high to low, the output signal of the OR circuit 621' is changed from high to low, so that the output signal of the AND circuit 622' is changed from high to low. As a result, after a delay time determined by the delay circuit 623', the delayed output signal, i.e., the offset control signal OPL1 is changed from high to low, as shown in FIG. 10F.

Even in the second embodiment, the offset voltage ΔV2 is not dependent upon the voltage at the bit line such as BL2.

Thus, in the FeRAM device of FIG. 9, since the offset voltage hardly fluctuates, it is possible to carry out a high reliability test.

Figure 11:
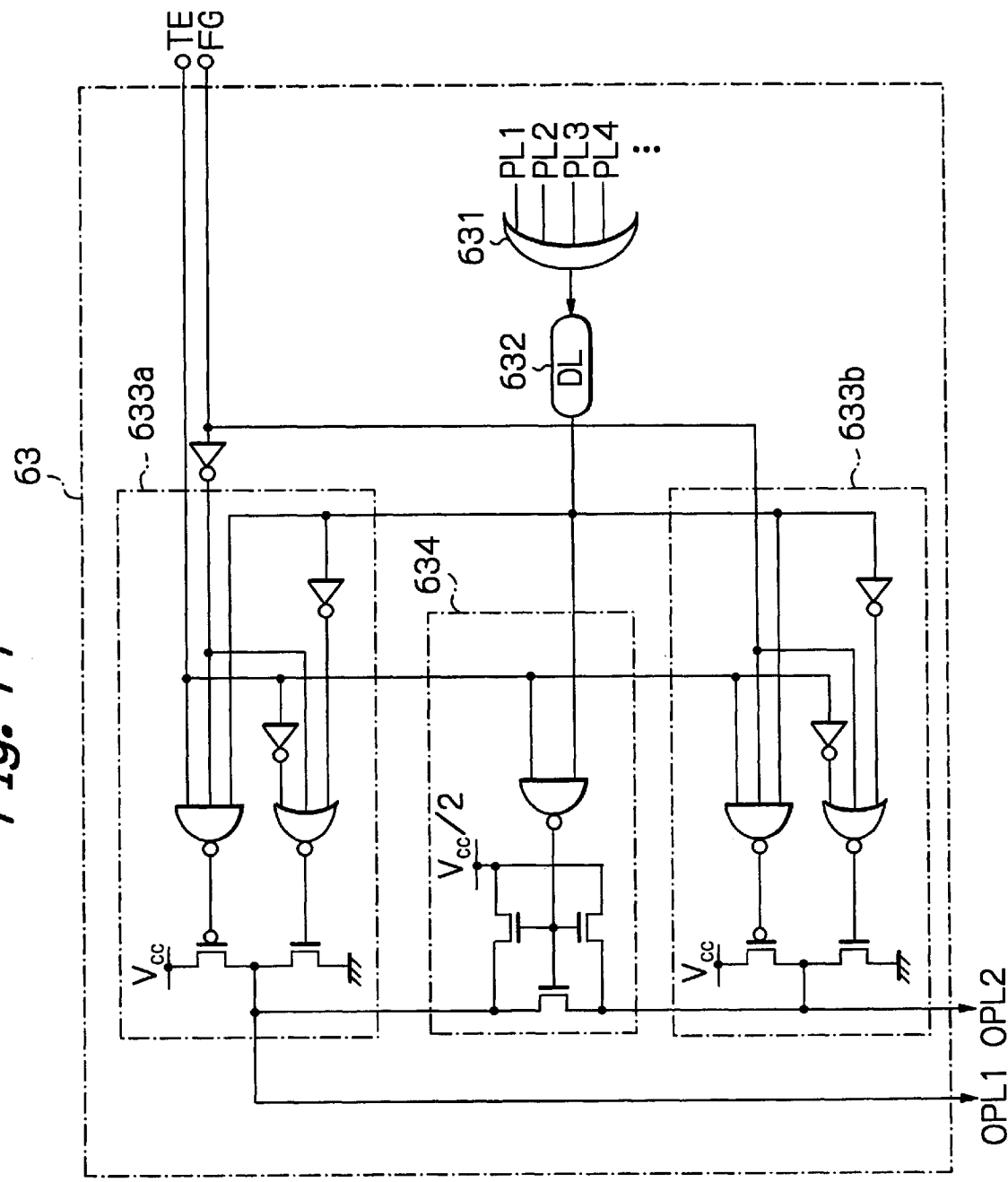
FIG. 11 is a circuit diagram illustrating a third embodiment of the FeRAM device according to the present invention.

In FIG. 11, which illustrates a third embodiment of the present invention, an offset control circuit 63 is provided instead of the offset control circuit 62 and 62' of FIGS. 6 and 9.

The offset control circuit 63 is constructed by an OR circuit 631 for receiving the signals of the plate lines PL1, PL2, PL3, PL4, . . . , a delay circuit 632 for delaying the output signal of the NOR circuit 631, a tri-state buffer circuit 633a for receiving the output signal of the delay circuit 632, the test signal TE and an inverted signal of a flag signal FG to generate an offset control signal OPL1, a tri-state buffer circuit 633b for receiving the output signal of the delay circuit 632, the test signal TE and the flag signal FG to generate an offset control signal OPL2, and a $V_{CC}/2$ generating circuit 634 for receiving the output signal of the delay circuit 632 to make the offset control signals OPL1 and OPL2 be $V_{CC}/2$ when all the signals of the plate signals PL1, PL2, PL3, PL4, . . . are low (=GND).

Note that the flag signal FG is a signal for determining an offset direction. That is, in a selection mode, when the voltages at the bit lines $\overline{BL2}$ and BL2 are high and low, respectively, the voltage of the flag signal FG is low (=GND). On the other hend, in a selection mode, when the voltages at the bit lines $\overline{BL2}$ and BL2 are low and high, respectively, the voltage of the flag signal FG is high (=$V_{CC}$). The flag signal FG is set in advance by the address predecoder 14 of FIG. 1.

The test operation of the FeRAM device of FIG. 11 is explained next with reference to FIGS. 12A through 12I, where the memory cell MC22 is tested under the test signal TE is "1" (high) and the flag signal FG is "1" (high).

Figure 12:
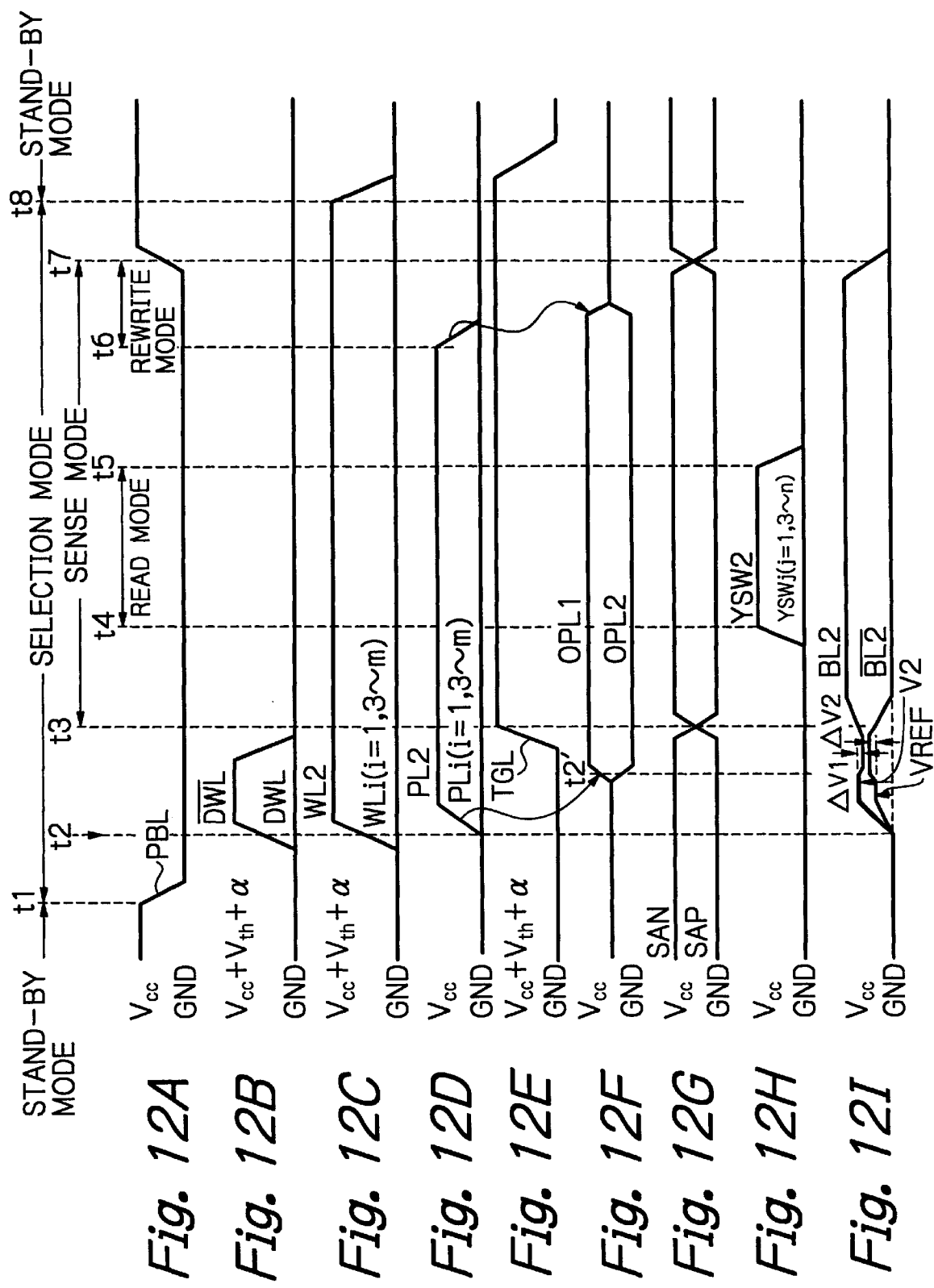
FIGS. 12A through 12I are timing diagrams for explaining the normal operation of the FeRAM device of FIG. 11.

In a test operation for the memory cell MC22, the offset control circuit 63 is operated to generate offset control signals OPL1 and OPL2 at time t2' after time t2 and before time t3, as shown in FIG. 12F. That is, at time t2, as shown in FIG. 12D, when the voltage at the plate line PL2 is changed from low to high, the output signal of the OR circuit 631 is changed from low to high. As a result, after a delay time determined by the delay circuit 632, the delayed output signal is changed from low to high. Therefore, the offset control signal OPL1 is changed from $V_{CC}/2$ to high (=$V_{CC}$), as shown in FIG. 12F. Thus, the voltage at the bit line $\overline{BL2}$ is increased by an offset voltage ΔV2 defined by the formula (2).

Simultaneously, the offset control signal OPL2 is changed from $V_{CC}/2$ to low (=GND), as shown in FIG. 12F. Thus, the voltage at the bit line BL2 is decreased by an offset voltage ΔV1 defined by the formula (1).

Then, at time t6, as shown in FIG. 12D, when the voltage at the plate line PL2 is changed from high to low, the output signal of the OR circuit 631 is changed from high to low. As a result, after a delay time determined by the delay circuit 632, the delayed output signal is changed from high to low. Therefore, the offset control signal OPL1 is changed from high (=$V_{CC}$) to $V_{CC}/2$, as shown in FIG. 12F. Similarly, the offset control signal OPL2 is changed from low(=GND) to $V_{CC}/2$.

Even in the third embodiment, the offset voltages ΔV1 and ΔV2 are not dependent upon the voltage at the bit line such as BL2.

Thus, in the FeRAM device of FIG. 11, since the offset voltage hardly fluctuates, it is possible to carry out a high reliability test.

Figure 13:
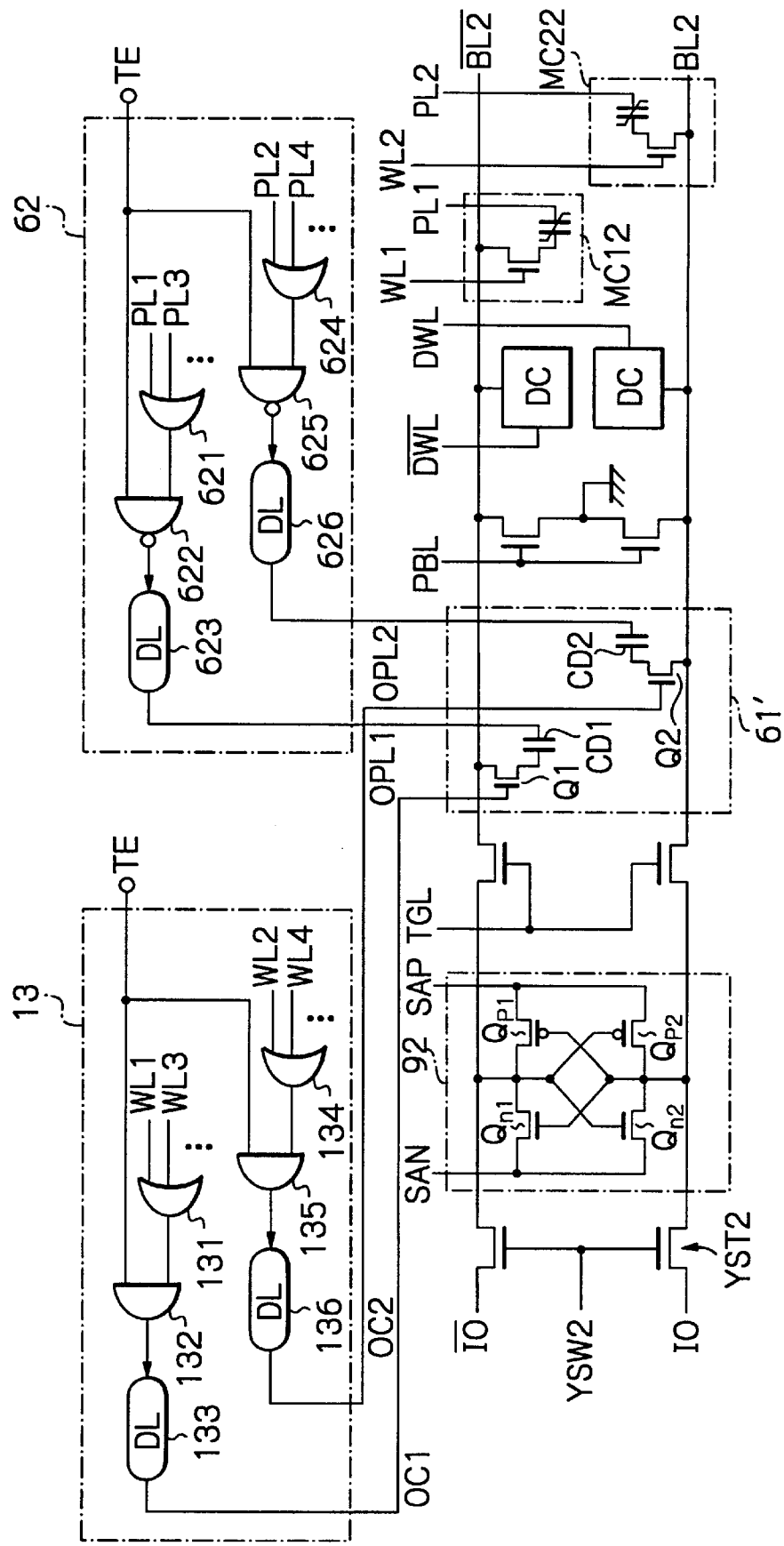
FIG. 13 is a circuit diagram illustrating a modification of the FeRAM device of FIG. 6.

In FIG. 13, which illustrates a modification of the FeRAM device of FIG. 6, an offset circuit 61' is provided instead of the offset circuit 61 of FIG. 6, and an offset validation circuit 13 is added to the FeRAM device of FIG. 6.

In the offset circuit 61' of FIG. 13, an N-channel MOS transistor Q1 is connected between the bit line $\overline{BL2}$ and the capacitor CD1, and an N-channel MOS transistor Q2 is connected between the bit line BL2 and the capacitor CD2. The transistors Q1 and Q2 are controlled by offset validation signals OC1 and OC2, respectively, of the offset validation circuit 13. That is, only when the offset circuit 61' is required to be operated for a test mode, is the transistor Q1 or Q2 turned ON, so that the capacitor CD1 or CD2 is connected to the bit line BL2 or $\overline{BL2}$. Otherwise, the transistors Q1 and Q2 are turned OFF to electrically separate the capacitors CD1 and CD2 separated from the bit lines $\overline{BL2}$ and BL2, so that the parasitic capacitance thereof can be substantially decreased. As a result, the normal operation speed is hardly affected by the presence of the capacitors CD1 and CD2.

The offset validation circuit 13 is constructed by an OR circuit 131 for receiving the signals of the word lines WL1, WL3, . . . , an AND circuit 132 for receiving the output signals of the OR circuit 131 and the test signal TE, and a delay circuit 133 for delaying the output signal of the AND circuit 132 to generate an offset validation signal OC1. Also, the offset validation circuit 13 is constructed by an OR circuit 134 for receiving the signals of the word lines WL2, WL4, . . . , an AND circuit 135 for receiving the output signal of the OR circuit 134 and the test signal TE, and a delay circuit 136 for delaying the output signal of the AND circuit 135 to generate an offset validation signal OC2.

Thus, the offset validation signals OC1 and OC2 have similar waveforms to those of the word lines such as WL1 and WL2, respectively.

Note that the modificaiton of FIG. 6 as illustrated in FIG. 13 can be applied to the second and third embodiments of the present invention as illustrated in FIGS. 9 and 11.

Figure 14:
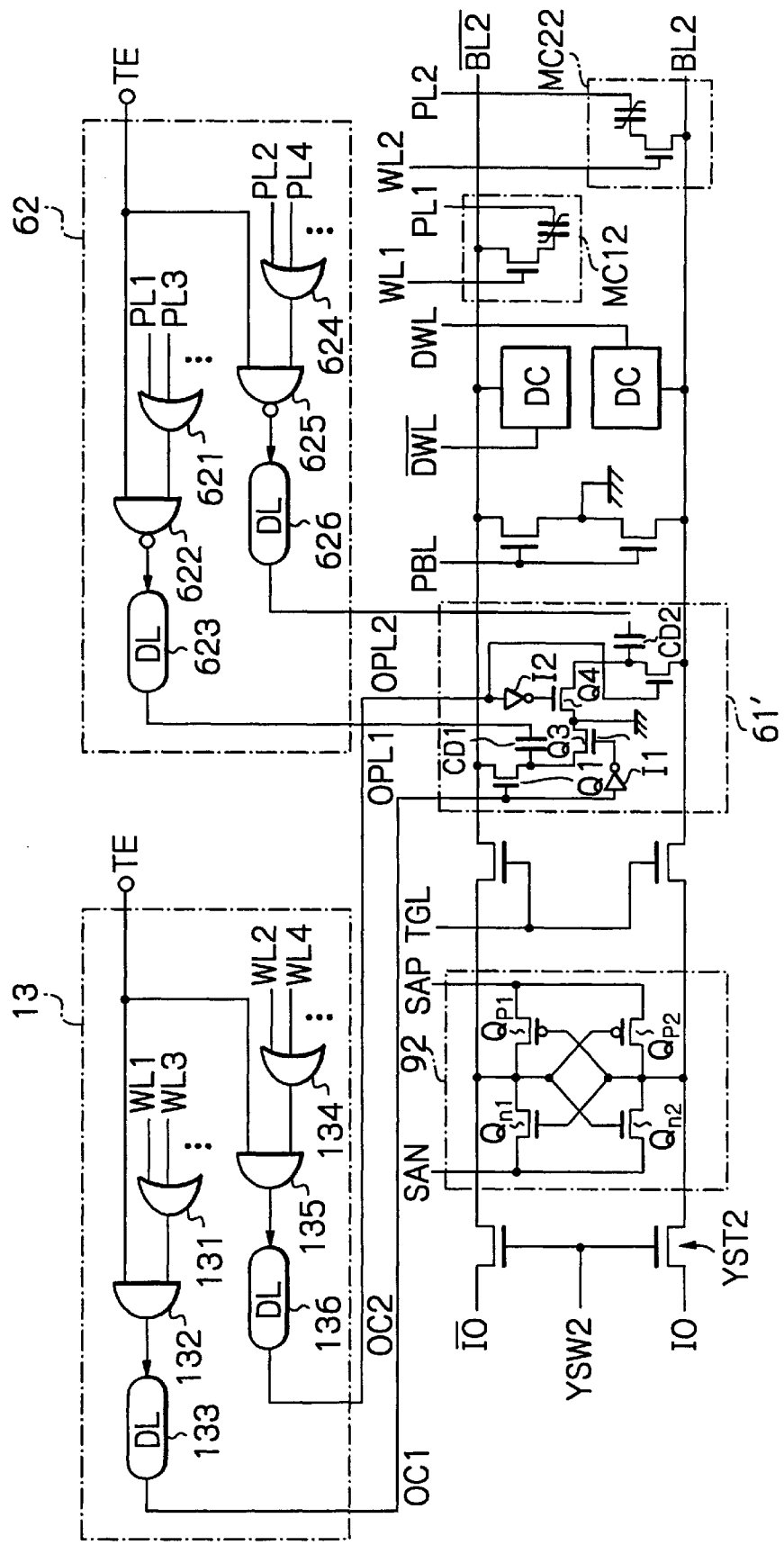
FIG. 14 is a circuit diagram illustrating a modification of the FeRAM device of FIG. 13.

In FIG. 14, which illustrates a modification of the FeRAM device of FIG. 13, an offset circuit 61" is provided instead of the offset circuit 61' of FIG. 13, thus preventing the nodes between the transistors Q1 and Q2 and the capacitors CD1 and CD2 from being in a floating state when the offset circuit 61" is not operated.

The offset circuit 61" further includes N-channel MOS transistors Q3 and Q4 and inverters I1 and I2 in addition to the elements of the offset circuit 61'. In this case, the node between the transistors Q3 and Q4 is grounded, because an offset operation is carried out to pull down the voltage at the bit line $\overline{BL2}$ or BL2.

Figure 15A:
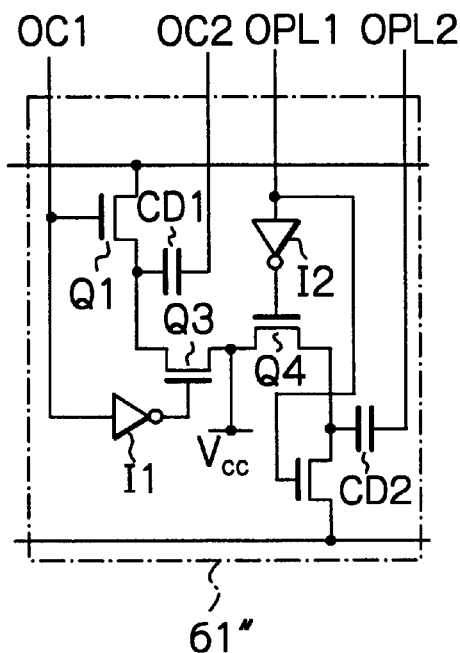
FIGS. 15A and 15B are circuit diagrams of modifications of the offset circuit of FIG. 14.
Figure 15B:
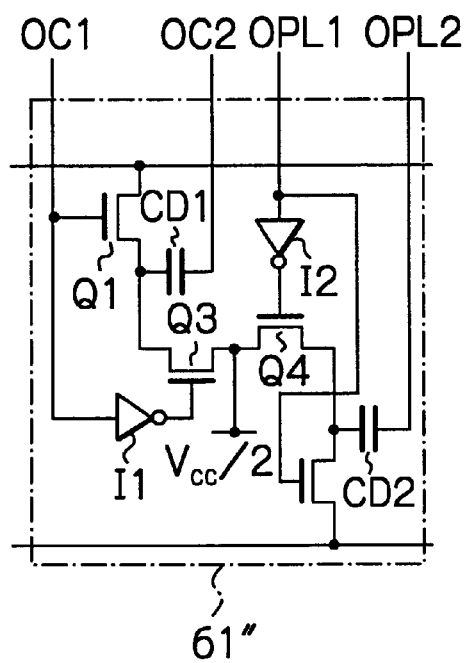

The modification of FIG. 13 as illustrated in FIG. 14 can be applied to the second and third embodiments of the present invention as illustrated in FIGS. 9 and 11. In the second embodiment, $V_{CC}$ is applied to the node between the transistors Q3 and Q4 as illustrated in FIG. 15A, because an offset operation is carried out to pull up the voltage at the bit line $\overline{BL2}$ or BL2. On the other hand, in the third embodiment, $V_{CC}/2$ is applied to the node between the transistors Q3 and Q4 as illustrated in FIG. 15B, because an offset operation is carried out to pull up or down the voltage at the bit line $\overline{BL2}$ or BL2.

Figure 16:
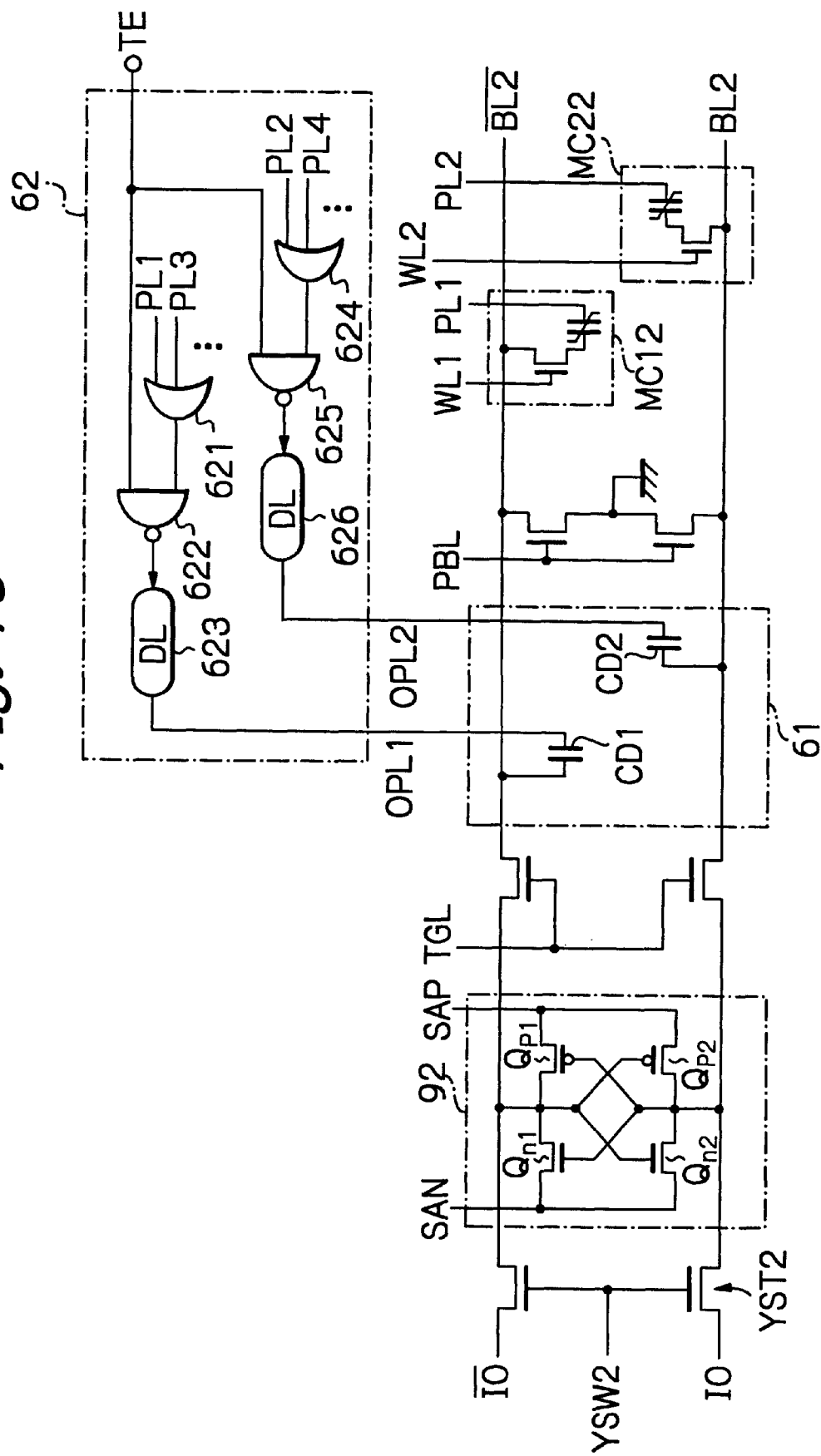
FIG. 16 is a circuit diagram illustrating a modification of the FeRAM device of FIG. 6.

In the above-described embodiments, a one-transistor, one-capacitor (1T/LC) type operation system where access of one memory cell is associated with access of its corresponding dummy cell; however, the present invention can be applied to a two-transistor, two-capacitor (2T/2C) type operation where access of one memory cell is associated with access of another memory cell, as illustrated in FIG. 16, which is a modification of the FeRAM device of FIG. 13. In FIG. 16, note that the dummy cells are removed. For example, if data "0" is written into the memory cell MC12, data "1" is written into the memory cell MC22.

Also, the present invention can be applied to other semiconductor memory devices than FeRAM devices.

As explained hereinabove, since the offset voltage hardly fluctuates, a high reliability test can be carried out.

What is claimed is:

1. A semiconductor memory device comprising:
   a plurality of word lines;
   a plurality of bit lines organized in bit-line-pairs;
   a plurality of memory cells, each connected between one of said word lines and one of said bit lines;
   a plurality of sense amplifiers, each connected to a corresponding one of said bit-line-pairs, for amplifying a difference in potential between bit lines of said corresponding bit-line-pair; and
   a corresponding plurality of offset circuits, each correspondingly connected to said one corresponding bit-line-pair, for applying an offset voltage to at least one of said bit lines of said corresponding bit-line-pair to reduce the difference in potential between the bit lines of said corresponding bit-line-pair,
   said offset voltage being independent of voltages at said bit lines.

2. The device as set forth in claim 1, wherein each said offset circuit comprises:
   first and second capacitors, each respectively connected to one bit line of said corresponding bit-line-pair; and
   an offset control circuit, connected to said first and second capacitors, for supplying an offset control signal to at least one of said first and second capacitors,
   said offset control signal being changed from a first level to a second level during a test mode.

3. The device as set forth in claim 2, wherein one of said first and second capacitors is connected to the bit line of said corresponding bit-line-pair having a higher voltage than the other, and wherein said first level comprises a power supply voltage and said second level comprises ground voltage.

4. The device as set forth in claim 2, wherein one of said first and second capacitors is connected to the bit line of said corresponding bit-line-pair having a lower voltage than the other, and wherein said first level comprises ground voltage and said second level comprises a power supply voltage.

5. The device as set forth in claim 1, wherein each said offset circuit comprises:
   first and second capacitors, each respectively connected to one bit line of said corresponding bit-line-pair; and
   an offset control circuit, connected to said first and second capacitors, for respectively supplying first and second offset control signals to said first and second capacitors,
   said first offset control signal being changed from an intermediate level between a first level and a second level to one of said first level and said second level during a test mode,
   said second offset control signal being changed from said intermediate level to the other of said first level and said second level during said test mode.

6. The device as set forth in claim 2, wherein each said offset circuit further comprises:
   a first field effect transistor connecting said first capacitor and said one bit line of said corresponding bit-line-pair;
   a second field effect transistor connecting said second capacitor and said other bit line of said corresponding bit-line-pair; and
   an offset validation circuit, connected to a gate of said first field effect transistor and to a gate of said second field effect transistor, for turning ON at least one of said first and second field effect transistors during said test mode.

7. The device as set forth in claim 6, wherein each said offset circuit further comprises:
   a third field effect transistor connected between said first capacitor and a node to which a definite voltage is applied;
   a fourth field effect transistor connected between said second capacitor and said node;
   a first inverter connected between a gate of said third field effect transistor and said offset validation circuit; and
   a second inverter connected between a gate of said fourth field effect transistor and said offset validation circuit.

8. The device as set forth in claim 7, wherein said definite voltage is one of said first and second levels.

9. The device as set forth in claim 7, wherein said definite voltage is an intermediate level between said first and second levels.

10. A ferroelectric random access memory device comprising:
    a plurality of word lines;
    a plurality of plate lines;
    a plurality of bit lines organized in bit-line-pairs;
    a plurality of memory cells of a one-transistor, one-ferroelectric-capacitor type, each connected to one of said word lines, one of said plate lines and one of said bit lines;
    a plurality of sense amplifiers, each connected to one of said bit-line-pairs, for amplifying a difference in potential between the bit lines of said bit-line-pair; and
    a corresponding plurality of offset circuits, each correspondingly connected to said one bit-line-pair, for applying an offset voltage to at least one bit line of said one bit-line-pair to reduce the difference in potential between the bit lines of said one bit-line-pair,
    said offset voltage being independent of voltage at said bit lines.

11. The device as set forth in claim 10, wherein each said offset circuit comprises:
    first and second capacitors, each respectively connected to one bit line of said corresponding bit-line-pair; and
    an offset control circuit, connected to said first and second capacitors, said plate lines, and a test terminal, for supplying an offset control signal to at least one of said first and second capacitors in accordance with voltages at said plate lines when a voltage at said test terminal is at a test mode voltage, said offset control signal being changed from a first level to a second level during said test mode.

12. The device as set forth in claim 11, wherein said one of said first and second capacitors is connected to the bit line of said corresponding bit-line-pair having a higher voltage than the other,
    said first level being a power supply voltage and said second level being a ground voltage.

13. The device as set forth in claim 11, wherein said one of said first and second capacitors is connected to the bit line of said corresponding bit-line-pair having a lower voltage than the other, said first level being a ground voltage and said second level being a power supply voltage.

14. The device as set forth in claim 10, wherein each said offset circuit comprises:

first and second capacitors, each respectively connected to one bit line of said corresponding bit-line-pair; and an offset control circuit, connected to said first and second capacitors, said plate lines, and a test terminal, for supplying first and second offset control signals to said first and second capacitors in accordance with voltages at said plate lines when a voltage at said test terminal is at a test mode voltage, said first offset control signal being changed from an intermediate level between a first level and a second level to one of said first level and said second level during said test mode, said second offset control signal being changed from said intermediate level to the other of said first level and said second level during said test mode.

15. The device as set forth in claim 11, wherein each said offset circuit further comprises:

a first field effect transistor connecting said first capacitor and said one bit line of said bit-line-pair;

a second field effect transistor connecting said second capacitor and the other bit line of said corresponding bit-line-pair; and an offset validation circuit, connected to gates of said first and second field effect transistors, said word lines, and said test terminal, for turning ON at least one of said first and second field effect transistors in accordance with voltages at said word lines when the voltage at said test terminal is at a test mode voltage.

16. The device as set forth in claim 15, wherein each said offset circuit further comprises:

a third field effect transistor connected between said first capacitor and a node to which a definite voltage is applied;

a fourth field effect transistor connected between said second capacitor and said node;

a first inverter connected between a gate of said third field effect transistor and said offset validation circuit; and a second inverter connected between a gate of said fourth field effect transistor and said offset validation circuit.

17. The device as set forth in claim 16, wherein said definite voltage is one of said first and second levels.

18. The device as set forth in claim 16, wherein said definite voltage is an intermediate level between said first and second levels.

19. A ferroelectric random access memory device comprising:

a plurality of bit-line-pairs; and a plurality of offset circuits, each connected to a corresponding one of said bit-line-pairs, for applying an offset voltage that reduces a voltage difference during a test mode between the two bit lines of said corresponding bit-line-pair, wherein said offset voltage comprises a constant voltage unaffected by a voltage level on either of said two bit lines.

20. An offset circuit in a ferroelectric random access memory device having a plurality of bit lines organized in bit-line-pairs, comprising:

a transistor switch controlled by a test mode input command; and a constant voltage source that is unaffected by a voltage on any of said bit lines, such that said constant voltage reduces a voltage difference between the bit lines of at least one selected said bit-line-pairs during said test mode.

21. A method of testing a ferroelectric random access memory device having a plurality of bit lines organized in bit-line-pairs, said method comprising:

injecting, during a test mode, a voltage offset to at least one of the two bit lines of at least one selected one of said bit-line-pairs to reduce a voltage difference between said two bit lines, wherein said voltage offset is derived from a source that is unaffected by a voltage on any of said bit lines.

* * * * *